(12) United States Patent
Chen et al.

(10) Patent No.: US 11,653,471 B2
(45) Date of Patent: May 16, 2023

(54) HEAT DISSIPATION DEVICE

(71) Applicant: AURAS TECHNOLOGY CO., LTD., New Taipei (TW)

(72) Inventors: Chih-Wei Chen, New Taipei (TW); Cheng-Ju Chang, New Taipei (TW); Jyun-Wei Huang, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 45 days.

(21) Appl. No.: 17/372,579

(22) Filed: Jul. 12, 2021

(65) Prior Publication Data

US 2022/0022339 A1 Jan. 20, 2022

Related U.S. Application Data

(60) Provisional application No. 63/053,953, filed on Jul. 20, 2020, provisional application No. 63/084,681, filed on Sep. 29, 2020.

(51) Int. Cl.
| | | |
|---|---|---|
| *H05K 7/20* | (2006.01) | |
| *F28D 15/04* | (2006.01) | |
| *F28D 15/02* | (2006.01) | |
| *F28F 1/22* | (2006.01) | |
| *F28F 1/32* | (2006.01) | |

(52) U.S. Cl.
CPC ......... *H05K 7/202* (2013.01); *F28D 15/0275* (2013.01); *F28D 15/04* (2013.01); *F28D 15/046* (2013.01); *F28F 1/22* (2013.01); *F28F 1/325* (2013.01); *F28D 15/0283* (2013.01)

(58) Field of Classification Search
CPC ..... H05K 7/202; F28D 15/0275; F28D 15/04; F28D 15/046; F28D 15/0283; F28F 1/22; F28F 1/325
See application file for complete search history.

(56) References Cited

U.S. PATENT DOCUMENTS

| | | | | |
|---|---|---|---|---|
| 6,978,829 | B1* | 12/2005 | Lin | H01L 23/4093 174/15.2 |
| 7,575,045 | B2* | 8/2009 | Sheng | F28D 15/0275 165/104.21 |
| 2004/0105235 | A1* | 6/2004 | Lai | F28F 1/32 361/700 |
| 2005/0141198 | A1* | 6/2005 | Lee | H01L 23/427 257/E23.088 |
| 2008/0115914 | A1* | 5/2008 | Yang | H01L 23/467 165/104.33 |
| 2008/0314556 | A1* | 12/2008 | Zhou | F28D 15/0266 165/104.33 |
| 2017/0153065 | A1* | 6/2017 | Lan | F28D 15/0275 |

(Continued)

*Primary Examiner* — Tho V Duong
(74) *Attorney, Agent, or Firm* — Amin, Turocy & Watson, LLP

(57) ABSTRACT

A heat dissipation device is provided and includes: a temperature equalizing plate unit; at least one first vapor chamber unit and at least one second vapor chamber unit disposed on an outer surface of the temperature equalizing plate unit; at least one first tower fin set disposed on the outer surface of the temperature equalizing plate unit to sleeve the first and second vapor chamber units and partially expose the second vapor chamber unit; and at least one second tower fin set disposed on a part of a surface of the first tower fin set to sleeve the exposed part of the second vapor chamber unit.

16 Claims, 7 Drawing Sheets

(56) References Cited

U.S. PATENT DOCUMENTS

2017/0198980 A1* 7/2017 Lan ................... F28D 15/0233
2020/0068745 A1* 2/2020 Lin .................... H05K 7/20336
2020/0217599 A1* 7/2020 Narasimhan .......... H01L 23/467

* cited by examiner

HEAT DISSIPATION DEVICE

BACKGROUND

1. Technical Field

The present disclosure generally relates to the heat dissipation field, and more specifically, to a heat dissipation device with vapor chambers and fin sets.

2. Description of Related Art

In the face of modernization, computers and various other electronic devices have seen rapid developments and continuously improved performance. However, along with these improvements, heat dissipation has become one of the major issues faced by high performance hardware today. In general, computers and various electronic devices employ heat dissipation components for dissipating the heat away. For example, a thermal paste or cooling fins can be attached onto an electronic component that is subjected to heat dissipation in order to absorb and disperse heat generated by the electronic component. However, heat dissipation effect provided by this type of heat dissipation method is rather limited. Therefore, heat dissipation components that take advantage of the phase changes of working fluids have been developed in order to facilitate heat transfer.

The heat dissipation components above typically achieve energy transfer by utilizing the phase changes and directions of flows of the working fluids. However, when faced with the large amount of heat generated by high power processors, heat cannot be dissipated effectively, resulting in poor heat dissipation efficiency.

Therefore, there is a need in the art to provide a heat dissipation device that addresses the aforementioned shortcomings of the prior art.

SUMMARY

In view of the aforementioned shortcomings of the prior art, the present disclosure provides a heat dissipation device, which includes: a temperature equalizing plate unit; at least one first vapor chamber unit and at least one second vapor chamber unit disposed on an outer surface of the temperature equalizing plate unit; at least one first tower fin set disposed on the outer surface of the temperature equalizing plate unit to sleeve the first vapor chamber unit and the second vapor chamber unit and partially expose the second vapor chamber unit; and at least one second tower fin set disposed on a part of a surface of the first tower fin set to sleeve the exposed part of the second vapor chamber unit.

The aforementioned heat dissipation device further includes at least one third vapor chamber unit disposed on the outer surface of the temperature equalizing plate unit.

In the aforementioned heat dissipation device, numbers of the first vapor chamber unit, the second vapor chamber unit and the third vapor chamber unit are plural, wherein the first vapor chamber units are disposed at intervals at two ends of the temperature equalizing plate unit, the second vapor chamber units are disposed between the first vapor chamber units at two ends of the temperature equalizing plate unit, and the third vapor chamber units are disposed on a middle portion of the temperature equalizing plate unit between the first vapor chamber units or the second vapor chamber units.

In the aforementioned heat dissipation device, each of the third vapor chamber units includes a body portion and a bent portion, wherein one end of the body portion is disposed on the outer surface of the temperature equalizing plate unit, and the bent portion is formed by bending and extending from the other end of the body portion, and a direction of bending of the bent portion is towards a side of the temperature equalizing plate unit.

The aforementioned heat dissipation device further includes at least one first vertical fin set and a second vertical fin set, wherein the first vertical fin set is disposed on the outer surface of the temperature equalizing plate unit and attaches to a side of the body portion of the third vapor chamber unit, and the second vertical fin set is disposed on the outer surface of the temperature equalizing plate unit and attaches to another side of the body portion of the third vapor chamber unit.

In the aforementioned heat dissipation device, fins of the first vertical fin set and the second vertical fin set are arranged in a different direction with respect to fins of the first tower fin set or the second tower fin set.

In the aforementioned heat dissipation device, a height of the second vertical fin set is greater than a height of the third vapor chamber unit extending from the outer surface, and a height of the first vertical fin set is less than the height of the third vapor chamber unit extending from the outer surface.

The aforementioned heat dissipation device further includes at least one third vertical fin set disposed on the first vertical fin set and the first tower fin set, wherein the third vertical fin set attaches to a side face of the second tower fin set and sleeves the bent portions of the third vapor chamber units, and wherein fins of the third vertical fin set are arranged in the same direction as fins of the first vertical fin set or the second vertical fin set.

In the aforementioned heat dissipation device, the third vertical fin set exposes ends of the bent portions extending towards a side of the temperature equalizing plate unit.

In the aforementioned heat dissipation device, the first vapor chamber unit is plate-shaped, and the second vapor chamber unit and the third vapor chamber unit are pipe-shaped.

The aforementioned heat dissipation device further includes: a hollow portion within each of the first vapor chamber unit, the second vapor chamber unit and the third vapor chamber unit; and a cavity within the temperature equalizing plate unit, wherein the hollow portions and the cavity are in communication with one another.

In the aforementioned heat dissipation device, the temperature equalizing plate unit includes an upper board, a lower board and a metal block, wherein the cavity is formed from the upper board and the lower board after assembly, and wherein the metal block is disposed on the lower board and extends to two opposite sides of the cavity and forms an airflow channel with the upper board.

In the aforementioned heat dissipation device, the cavity is filled with working fluids obstructed by the metal block.

In the aforementioned heat dissipation device, the temperature equalizing plate unit further includes at least two first capillary structures and at least two second capillary structures, wherein each of the first capillary structures is disposed on the lower board and each comes into contact with a side of the metal block, and wherein each of the second capillary structures is disposed on the lower board and connected with the first capillary structure and extending to a projected location of the first vapor chamber unit or the second vapor chamber unit on the lower board.

In the aforementioned heat dissipation device, each of the second capillary structures further extends into the hollow portion of the first vapor chamber unit or the second vapor chamber unit.

In the aforementioned heat dissipation device, the temperature equalizing plate unit further includes a plurality of spacer metal blocks disposed on the lower board and extending to one of another two opposite sides of the cavity.

In the aforementioned heat dissipation device, the metal block and each of the first capillary structures are correspondingly located near a geometric center of the third vapor chamber units and above a heat source that is in contact with the temperature equalizing plate unit.

In the aforementioned heat dissipation device, a height of the first vapor chamber unit extending from the outer surface is less than a height of the second vapor chamber unit extending from the outer surface.

In the aforementioned heat dissipation device, a direction in which fins of the first tower fin set and the second tower fin set are arranged is the same as a direction in which the first vapor chamber unit and the second vapor chamber unit extend from the outer surface of the temperature equalizing plate unit.

In the aforementioned heat dissipation device, the first tower fin set exposes a top surface of the first vapor chamber unit.

In the aforementioned heat dissipation device, the second tower fin set exposes a top surface of the second vapor chamber unit.

DETAILED DESCRIPTION OF THE EMBODIMENTS

Implementations of the present disclosure are illustrated using the following embodiments. One of ordinary skill in the art can readily appreciate other advantages and technical effects of the present disclosure upon reading the content of this specification.

Figure 1:
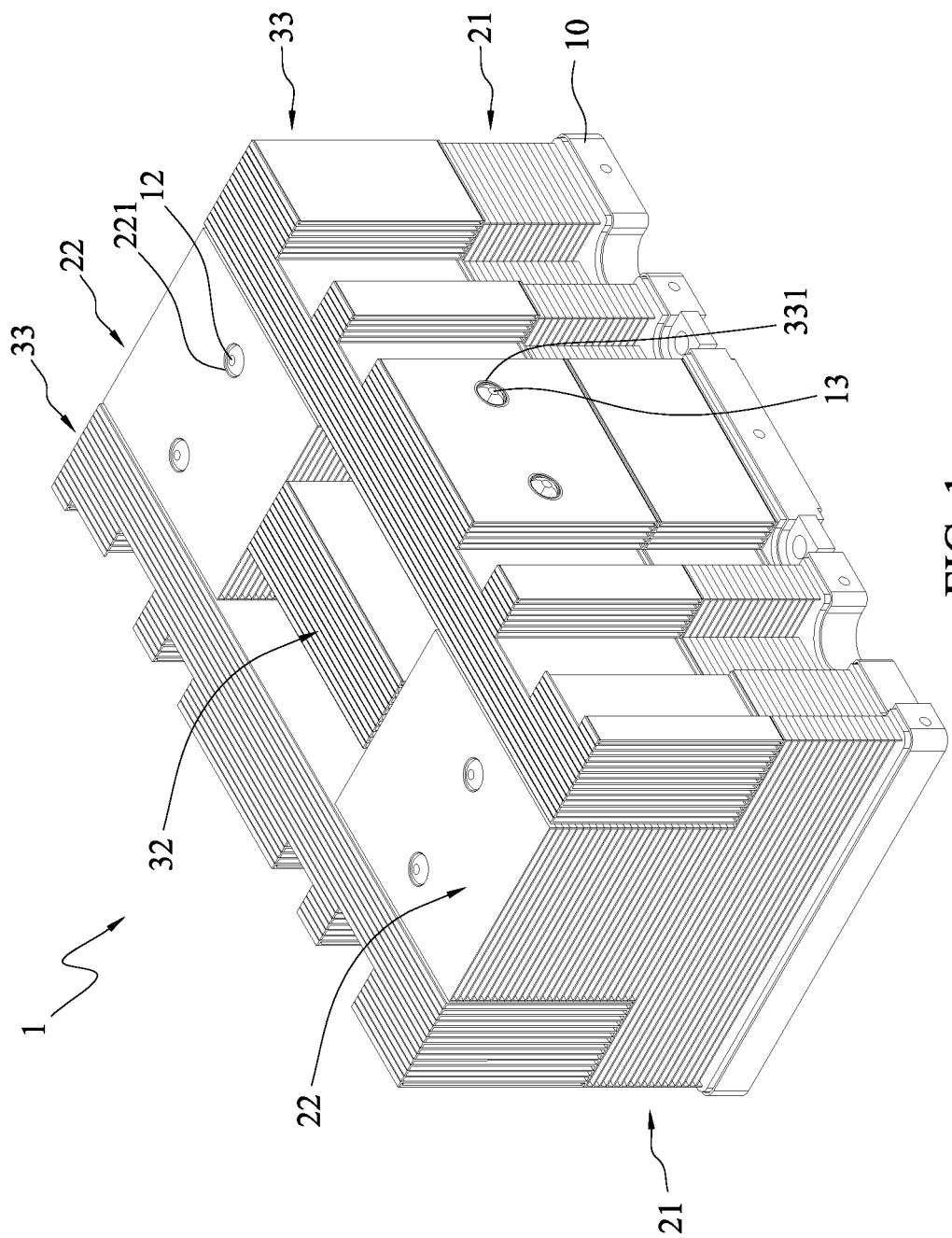
FIG. 1 is a schematic overall view of a heat dissipation device in accordance with the present disclosure.
Figure 2:
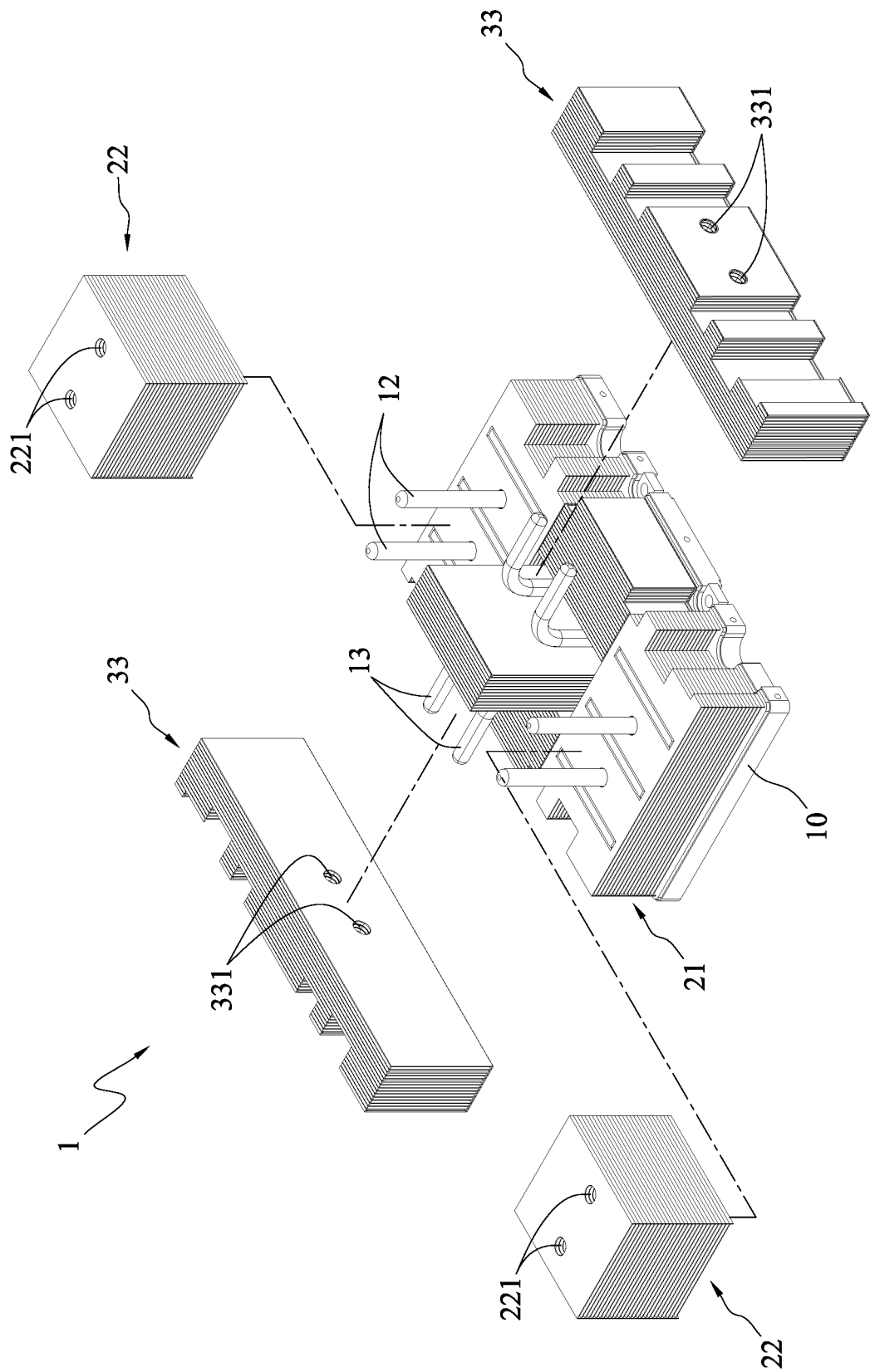
FIG. 2 is a schematic exploded view of the heat dissipation device in accordance with the present disclosure.
Figure 3:
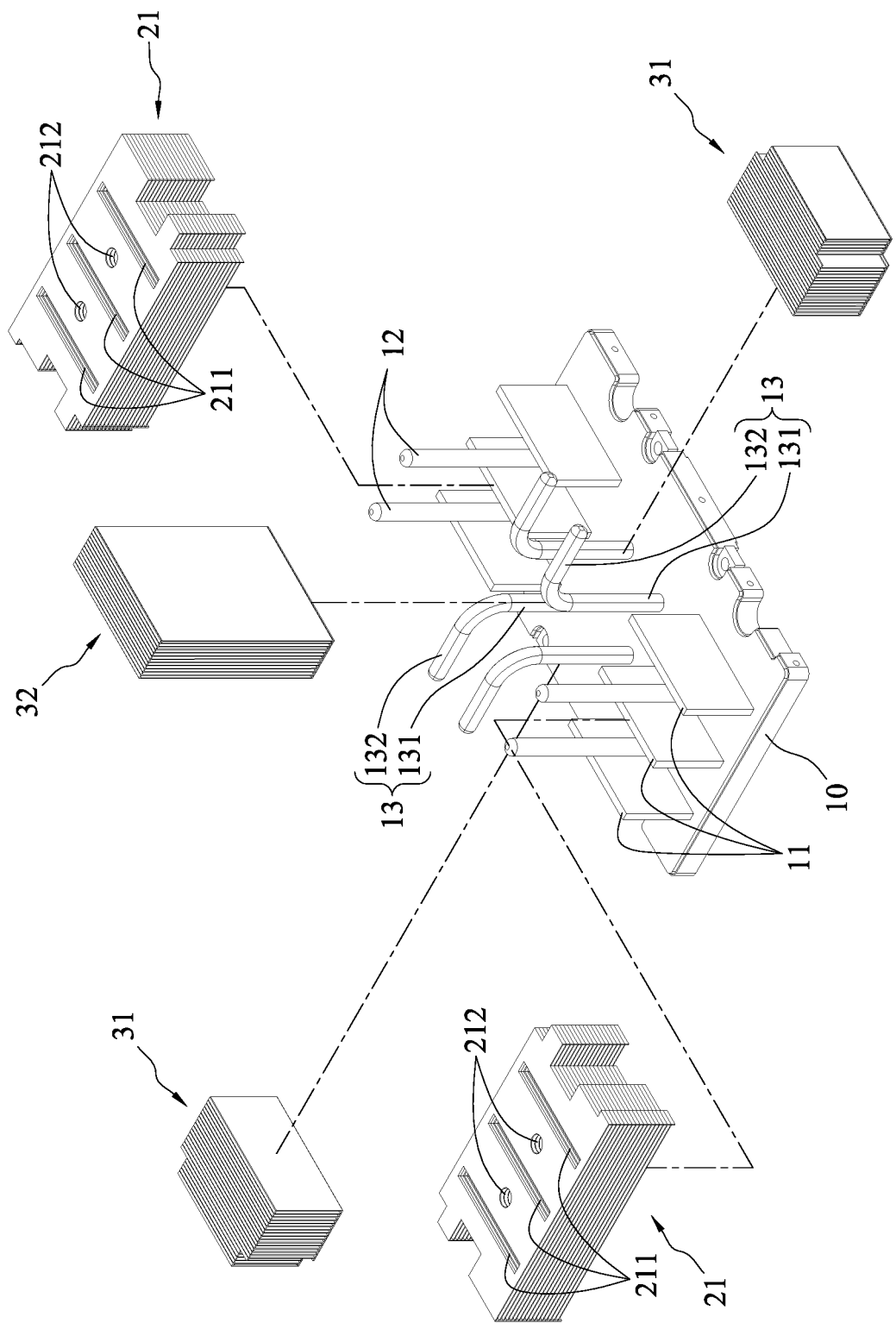
FIG. 3 is another schematic exploded view of the heat dissipation device in accordance with the present disclosure.
Figure 4:
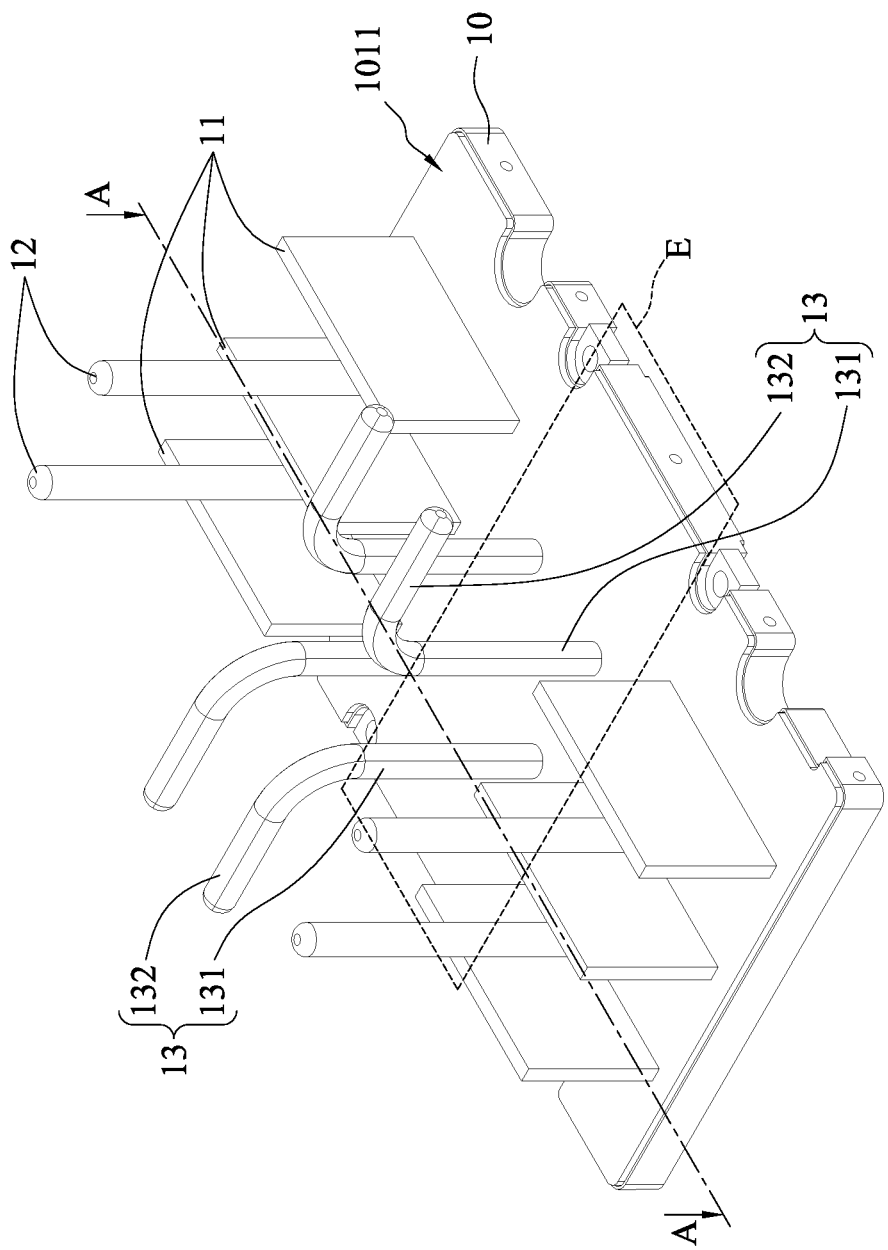
FIG. 4 is a schematic overall view of a temperature equalizing plate unit in the heat dissipation device in accordance with the present disclosure.

Referring to FIGS. 1, 2 and 3, FIG. 1 is a schematic overall view of a heat dissipation device 1 in accordance with the present disclosure; FIG. 2 is a schematic exploded view of a second tower fin set 22 and a third vertical fin set 33 in the heat dissipation device 1 in accordance with the present disclosure; FIG. 3 is a schematic exploded view of a first tower fin set 21, a first vertical fin set 31 and a second vertical fin set 32 in the heat dissipation device 1 in accordance with the present disclosure without showing the second tower fin set 22 and the third tower fin set 33; and FIG. 4 is a schematic overall view of a temperature equalizing plate unit 10 in the heat dissipation device 1 in accordance with the present disclosure. The heat dissipation device 1 of the present disclosure includes the temperature equalizing plate unit 10 and a plurality of fin sets disposed on the temperature equalizing plate unit 10 (e.g., first and second tower fin sets 21 and 22, and first, second and third vertical fin sets 31, 32 and 33 etc.). A fin set recited herein refers to a structure made up of a plurality of fins arranged at intervals. Technical details of which are described as follows.

In an embodiment, as shown in FIG. 4, at least a first vapor chamber unit 11, at least a second vapor chamber unit 12 and at least a third vapor chamber unit 13 are disposed on an outer surface 1011 of the temperature equalizing plate unit 10. For instance, the first vapor chamber unit 11, the second vapor chamber unit 12 and the third vapor chamber unit 13 extend outwards from the outer surface 1011 of the temperature equalizing plate unit 10. The direction of extension can be arbitrary, most preferably perpendicular to the outer surface 1011, but the present disclosure is not limited as such. In addition, the first vapor chamber unit 11, the second vapor chamber unit 12 and the third vapor chamber unit 13 can be integrally formed with the temperature equalizing plate unit 10, or soldered onto the outer surface 1011 of the temperature equalizing plate unit 10 through a soldering process, but the present disclosure is not limited to the above.

In an embodiment, the quantities of the first vapor chamber unit 11, the second vapor chamber unit 12 and the third vapor chamber unit 13 can be plural. For example, 6 first vapor chamber units 11, 4 second vapor chamber units 12, and 4 third vapor chamber units 13 are shown in FIG. 4. However, the present disclosure is not limited as such, and the quantities can be adjusted according to the needs.

In an embodiment, the first vapor chamber units 11 are plate-shaped and can be heat dissipation components such as vapor chambers. The second vapor chamber units 12 and the third vapor chamber units 13 are pipe-shaped and can be heat dissipation components such as heat pipes with circular, oval or polygonal cross-sectional shapes along the radial directions. The present disclosure is not limited to the above.

In an embodiment, the plurality of first vapor chamber units 11 are disposed at intervals at two ends of the temperature equalizing plate unit 10. For example, the plurality of first vapor chamber units 11 are disposed at two ends of the temperature equalizing plate unit 10 along the longer side of the temperature equalizing plate unit 10, and are disposed at intervals along the shorter side of the temperature equalizing plate unit 10. The plurality of second vapor chamber units 12 are disposed between the various first vapor chamber units 11 and at two ends of the temperature equalizing plate unit 10, for example, disposed at intervals along the shorter side of the temperature equalizing plate unit 10 and disposed between the first vapor chamber units 11. The third vapor chamber units 13 are disposed on the middle portion of the temperature equalizing plate unit 10, that is, between the first vapor chamber units 11 and the second vapor chamber units 12 at the two ends of the temperature equalizing plate unit 10. For instance, the third vapor chamber units 13 can be disposed on imaginary lines connecting between the second vapor chamber units 12 on the two ends of the temperature equalizing plate unit 10, and these imaginary lines can be parallel to the longer side of the temperature equalizing plate unit 10. The arrangements of the first vapor chamber units 11, the second vapor chamber units 12 and the third vapor chamber units 13 described above can be altered according to the needs, and the present disclosure is not limited as such.

In an embodiment, each of the third vapor chamber units 13 includes a body portion 131 and a bent portion 132. One end of the body portion 131 is disposed on the outer surface 1011 of the temperature equalizing plate unit 10, and the bent portion 132 is formed by bending and extending from the other end of the body portion 131. The direction of the bend of the bent portion 132 may be towards the outside of the temperature equalizing plate unit 10 (e.g., towards a side of the temperature equalizing plate unit 10), and the bend may be approximately at right angle, but the present disclosure is not limited as such.

In an embodiment, as shown in FIG. 3, the first tower fin set 21 can be disposed on the outer surface 1011 of the temperature equalizing plate unit 10 to sleeve the first vapor chamber units 11 and the second vapor chamber units 12. For example, the first tower fin set 21 can include holes 211 and holes 212 penetrating through the two sides thereof for receiving the first vapor chamber units 11 and the second vapor chamber units 12, respectively. The shape of the holes 211 can approximate the shape of the first vapor chamber units 11, such that the first vapor chamber units 11 are sleeved within the holes 211 completely. The shape of the holes 212 can approximate the shape of the second vapor chamber units 12, for example, the cross-sectional shape along the radial direction. However, the height of the first vapor chamber units 11 extending from the outer surface 1011 is lower than the height of the second vapor chamber units 12 extending from the outer surface 1011. As such, after the first vapor chamber units 11 and the second vapor chamber units 12 are received in the holes 211 and holes 212 of the first tower fin set 21, respectively, portions of the second vapor chamber units 12 are still exposed above the first tower fin set 21.

In an embodiment, the quantity of the first tower fin set 21 is two for sleeving the first vapor chamber units 11 and the second vapor chamber units 12 at the two ends of the temperature equalizing plate unit 10, respectively. However, the present disclosure is not limited to this, and the quantity of the first tower fin set 21 can be adjusted according to the requirements.

In an embodiment, the fins of the first tower fin set 21 can be arranged in a direction that is the same as the direction along which the first vapor chamber units 11 and the second vapor chamber units 12 extend from the outer surface 1011 of the temperature equalizing plate unit 10, so as to maximize the efficiency in heat dissipation for the first vapor chamber units 11 and the second vapor chamber units 12.

In an embodiment, the first vertical fin set 31 is disposed on the outer surface 1011 of the temperature equalizing plate unit 10, for example, along the longer side of the temperature equalizing plate unit 10 and attaches to (e.g., abuts against) one side of the body portions 131 of the third vapor chamber units 13. The quantity of the first vertical fin set 31 is two, each of which is disposed along one of the two longer sides of the temperature equalizing plate unit 10 and attaches to a side of the body portion 131 of a different third vapor chamber unit 13 that is adjacent to said longer side of the temperature equalizing plate unit 10. The second vertical fin set 32 is similarly disposed on the outer surface 1011 of the temperature equalizing plate unit 10, and attaches to the other side of the body portions 131 of the third vapor chamber units 13. The quantity of the second vertical fin set 32 is one, and the second vertical fin set 32 is disposed between two third vapor chamber units 13 and concurrently attaches to sides of the body portions 131 of different third vapor chamber units 13 that are away from the longer sides of the temperature equalizing plate unit 10.

In an embodiment, the fins of the first vertical fin set 31 are arranged in a direction that is the same as or different from the direction in which the fins of the second vertical fin set 32 are arranged, but the direction in which the fins of the first vertical fin set 31 and the second vertical fin set 32 are arranged is different from the direction in which the fins of the first tower fin set 21 are arranged. This is because the fins of the first tower fin set 21 are arranged in a direction so as to maximize the heat dissipation efficiency for the first vapor chamber units 11 and the second vapor chamber units 12, whereas the fins of the first vertical fin set 31 and the second vertical fin set 32 are arranged in a direction so as to facilitate heat dissipation for both the temperature equalizing plate unit 10 and the body portions 131 of the third vapor chamber units 13.

In an embodiment, the height of the second vertical fin set 32 is greater than the height of the third vapor chamber units 13 extending from the outer surface 1011, and the height of the first vertical fin set 31 is less than the height of the third vapor chamber units 13 extending from the outer surface 1011. Further, since the third vapor chamber units 13 has a bent portion 132, the first vertical fin set 31 fits between the temperature equalizing plate unit 10 and the bent portion 132, so the height of the first vertical fin set 31 is less than the height between the bent portion 132 of the third vapor chamber units 13 and the outer surface 1011. In addition, the location of the second vertical fin set 32 is not hindered by the bent portions 132, so the height of the second vertical fin set 32 can be made to be greater than the overall height of the third vapor chamber units 13 extending from the outer surface 1011 in order to improve heat dissipation efficiency.

In an embodiment, after the first tower fin set 21, the first vertical fin set 31 and the second vertical fin set 32 are disposed on the outer surface 1011 of the temperature equalizing plate unit 10, further referring to FIG. 2, a second tower fin set 22 and a third vertical fin set 33 can be further provided on the first tower fin set 21 and the first vertical fin set 31, respectively. For instance, the second tower fin set 22 can be disposed on a portion of the surface of the first tower fin set 21 and can partially or completely sleeve the exposed portions of the second vapor chamber units 12. For example, the second tower fin set 22 includes holes 221 penetrating through two sides thereof. The shape of the holes 221 can resemble the shape of the second vapor chamber units 12, for example, the cross-sectional shape along the radial direction to receive the portions of the second vapor chamber units 12 that are not sleeved by the first tower fin set 21, such that the second vapor chamber units 12 are not protruding or protruding from the top surface of the second tower fin set 22. In an embodiment, the fins of the second tower fin set 22 can be arranged in the same direction as the fins of the first tower fin set 21, that is, in the same direction as that in which the second vapor chamber units 12 extend from the outer surface 1011 of the temperature equalizing plate unit 10, but in a different direction from that in which the fins of the first vertical fin set 31 and the second vertical fin set 32 are arranged.

In another embodiment, the quantity of the second tower fin set 22 can be two, which are disposed on portions of the surfaces of the first tower fin sets 21 at the two ends of the temperature equalizing plate unit 10, but the present disclosure is not limited as such, and the quantity of the second tower fin set 22 can be adjusted according to the needs. In addition, the second vertical fin set 32 can be in proximity to the second tower fin sets 22 and located between the two second tower fin sets 22.

The third vertical fin set 33 is concurrently disposed on both a first vertical fin set 31 and a first tower fin set 21 and attaches to a side of the second tower fin set 22, and sleeves the bent portions 132 of the third vapor chamber units 13. The third vertical fin set 33 includes holes 331 penetrating through two sides thereof. The shape of the holes 331 can resemble the shape of the bent portions 132 of the third vapor chamber units 13, for example, the cross-sectional shape along the radial direction in order to receive the bent portions 132. In an embodiment, the fins of the third vertical fin set 33 are arranged in the same directions as the fins of the first vertical fin set 31 or the second vertical fin set 32. In addition, the quantity of the third vertical fin set 33 can be two, which are disposed on two first vertical fin sets 31, respectively, and spanning above parts of the surfaces of the first tower fin sets 21 at the two ends of the temperature equalizing plate unit 10, and sandwiching the second tower fin sets 22 therebetween. However, the present disclosure is not limited as such, and the quantity of the third vertical fin set 33 can be adjusted according to the needs.

In an embodiment, after the various fin sets are disposed on the outer surface 1011 of the temperature equalizing plate unit 10, the top surfaces of the second tower fin sets 22 can be flush with the top surfaces of the second vertical fin set 32 and the third vertical fin sets 33, and the sides of the first tower fin sets 21, the second tower fin sets 22 and the third vertical fin sets 33 can be flush. Moreover, although the directions of the fins of the first tower fin sets 21 and the second tower fin sets 22 are arranged differently from the directions of the fins of the first vertical fin sets 31 and the second vertical fin set 32, but the gaps between the various fins of the first tower fin sets 21 and the second tower fin sets 22 are in communication with the gaps of the various fins of the first vertical fin sets 31 and the second vertical fin set 32. As such, air (from the left side of FIG. 1) can flow smoothly through the first tower fin set 21/second tower fin set 22 (on the left side of FIG. 1), the first vertical fin sets 31/second vertical fin set 32, and the first tower fin set 21/second tower fin set 22 (on the right side of FIG. 1) in order to dissipate heat from the first vapor chamber units 11, the second vapor chamber units 12 and the body portions 131 of the third vapor chamber units 13. Moreover, air can also flow into one end of the third vertical fin sets 33 (on the left side of FIG. 1) and out from the other end thereof (e.g., the right side of FIG. 1) in order to dissipate heat from the bent portions 132 of the third vapor chamber units 13.

In an embodiment, the holes 211 of the first tower fin sets 21 can expose the top surfaces of the first vapor chamber units 11, the holes 221 of the second tower fin sets 22 can expose the top surfaces of the second vapor chamber units 12, and the holes 331 of the third vertical fin sets 33 can expose the ends of the bent portions 132 of the third vapor chamber units 13 that extend towards the sides of the temperature equalizing plate unit 10. However, the present disclosure is not limited as such.

Figure 5:
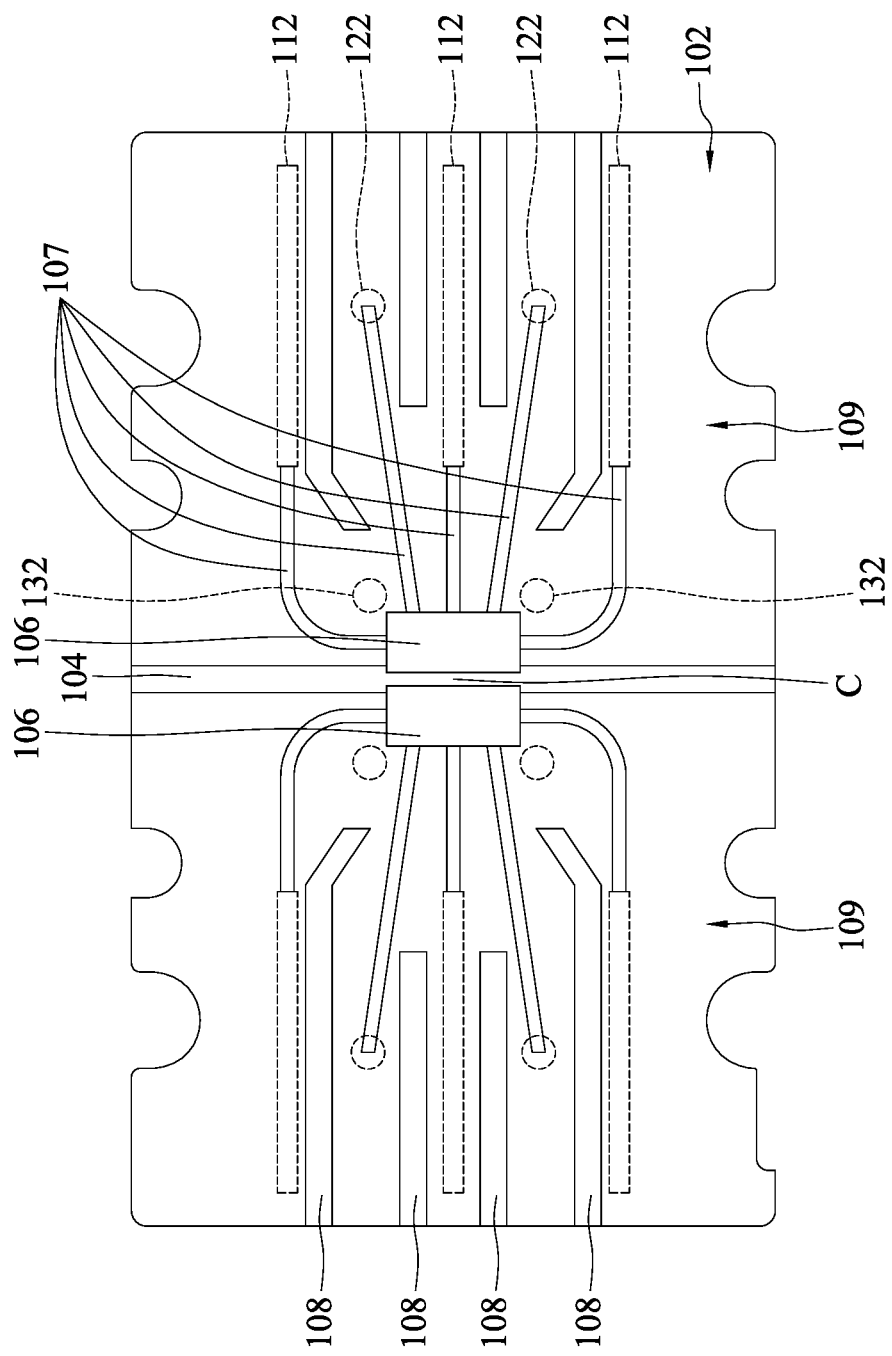
FIG. 5 is a schematic top view of a bottom plate of the temperature equalizing plate unit in the heat dissipation device in accordance with the present disclosure.
Figure 6:
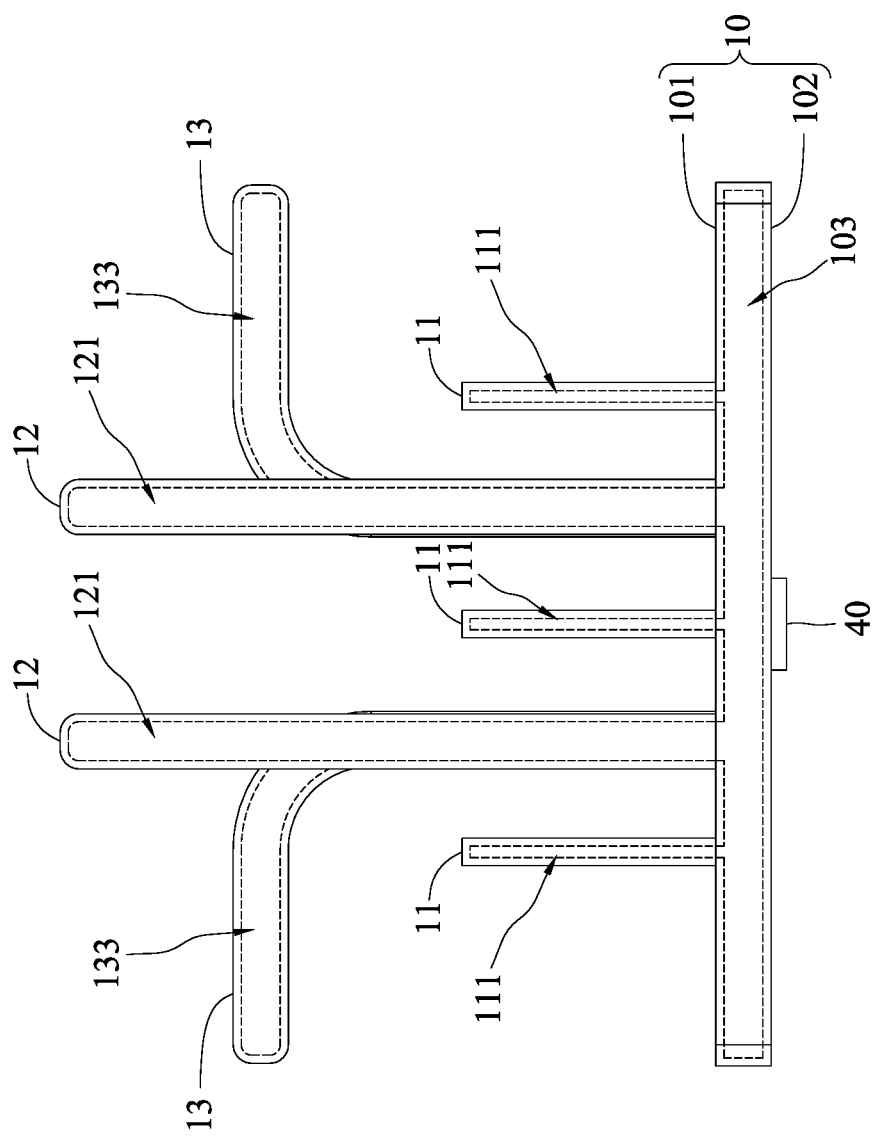
FIG. 6 is a schematic side view of the temperature equalizing plate unit in the heat dissipation device in accordance with the present disclosure.
Figure 7:
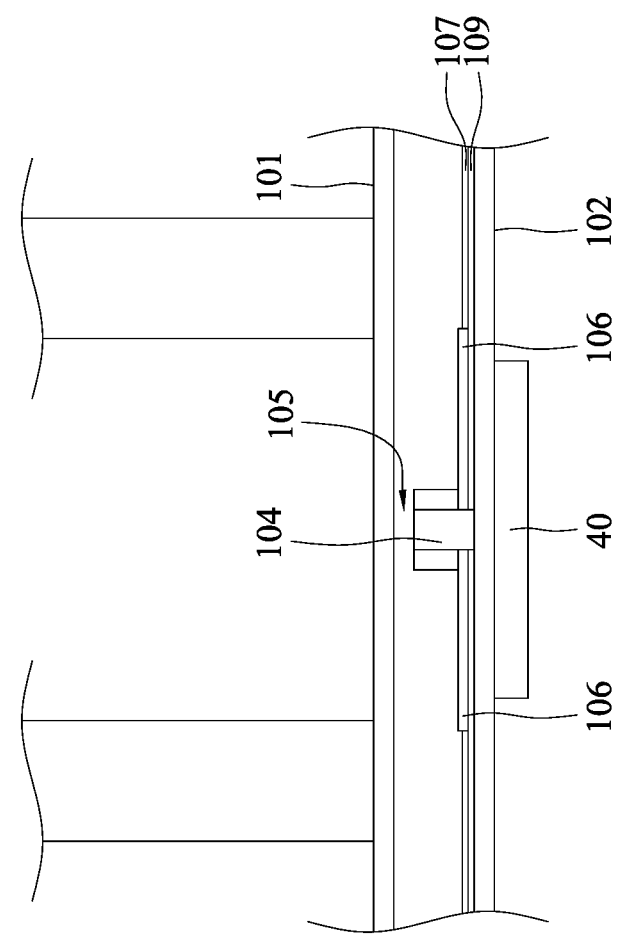
FIG. 7 is a schematic cross-sectional view of a region E of the temperature equalizing plate unit of FIG. 4 under section line A-A.

Referring to FIGS. 5, 6 and 7, the internal structure of the temperature equalizing plate unit 10 is illustrated. As shown in FIG. 6, the temperature equalizing plate unit 10 can include an upper board 101 and a lower board 102 with a cavity 103 formed therein. Hollow portions 111 are formed in the first vapor chamber units 11, hollow portions 121 are formed in the second vapor chamber units 12, and hollow portions 133 are formed in the third vapor chamber units 13, wherein the hollow portions 111, 121 and 133 are in communication with one another.

As shown in FIG. 5, the temperature equalizing plate unit 10 can further include a metal block 104 provided on the lower board 102. The metal block 104 is located in the cavity 103 and extends to two opposite sides of the cavity 103. For example, the metal block 104 can be strip-like and two ends thereof extend to the two opposite longer sides of the cavity 103, respectively. As shown in FIG. 7, although the metal block 104 is disposed on the lower board 102, the metal block 104 is free from being in contact with the upper board 101, but rather forms a gap with the upper board 101. Such a gap can serve as an airflow channel 105. The cavity 103 is filled with a working fluid to a height that is lower than the height of the metal block 104 disposed on the lower board 102, such that the working fluid is hindered by the metal block 104 to remain in two separate ends of the cavity 103. The working fluids in either ends cannot communicate with each other in the liquid phase, but can communicate with each other through the airflow channel 105 in the gas phase.

In an embodiment, the temperature equalizing plate unit 10 further includes at least two first capillary structures 106 and at least two second capillary structures 107. Each of the first capillary structures 106 can be disposed on the lower board 102 and contacts either side of the metal block 104, that is, each of the first capillary structures 106 can serve as a boundary for the metal block 104, and the first capillary structures 106 are partitioned by the metal block 104. Each of the second capillary structures 107 can be disposed on the lower board 102 with one end connected to a first capillary structure 106 and the other end extends to the vicinity of a projected location 112 of a first vapor chamber unit 11 or a projected location 122 of a second vapor chamber unit 12 on the lower board 102. In an embodiment, a plurality of liquid channels 109 can be formed on a surface of the lower board 102. The liquid channels 109 can be regarded as a capillary layer for receiving the working fluid. For example, the liquid channels 109 can be formed from sintered bodies, metal mesh bodies, grooves, or a combination of the above, wherein sintered bodies refer to structures with multiple pores or interconnected holes formed by sintering metal powder; metal mesh bodies refer to woven meshes having multiple meshes formed by metal weaving; and grooves refer to a plurality of interconnected grooves formed from interconnected gaps between a plurality of columns that are etched into the surface of the lower board 102 by wet etching the surface of the lower board 102. The first capillary structures 106 and the second capillary structures 107 are structures formed on the liquid channels 109, such as structures made of fiber, sintered bodies or metal mesh bodies. The first capillary structures 106 are rectangular, and the second capillary structures 107 are elongated. In other embodiments, in the case that the second capillary structures 107 are made of fiber or metal mesh bodies, said other end of each of the second capillary structures 107 extends not only to the projected location 112 or 122, but further upwards into the hollow portion 111 of the first vapor chamber unit 11 or the hollow portion 121 of the second vapor chamber unit 12. The second capillary structure 107 in the hollow portion 111 or 121 is fixed or not fixed to the inner wall (not shown) of the first vapor chamber unit 11 or the second vapor chamber unit 12.

In an embodiment, the metal block 104 and each of the first capillary structures 106 may be correspondingly located near the geometric center of the third vapor chamber units 13, such as a geometric center C among projected locations 132 of the various third vapor chamber units 13 on the lower board 102, and the first capillary structures 106 are contained in a polygon formed by the various projected locations 132, but the present disclosure is not limited as such. In addition, the lower board 102 of the temperature equalizing plate unit 10 may be in contact with a heat source 40. The location of the heat source 40 may be correspondingly located near the geometric center C, such that the metal block 104 and each of the first capillary structures 106 are located above the heat source 40. In other embodiments, the heat source 40 is not only located near the geometric center C, but underneath the entire lower board 102, and the present disclosure is not limited as such. The role of the liquid channels 109 or the first capillary structures 106 is to gather the working fluids in the liquid phase, whereas the role of the second capillary structures 107 is to deliver the liquid working fluids in the hollow portions 111 and 121 to the first capillary structures 106, so that the liquid working fluids are always available in the first capillary structures 106 for the heat source 40, and that the liquid working fluids can be distributed appropriately and evaporated rapidly into the gas phase.

In an embodiment, the thicknesses of the first capillary structures 106 are greater than the thicknesses of the second capillary structures 107 to receive more liquid working fluids from the second capillary structures 107, thereby improving heat dissipation of the heat source 40. However, the present disclosure is not limited as such.

In an embodiment, the temperature equalizing plate unit 10 further includes a plurality of spacer metal blocks 108 provided on the lower board 102. Each of the spacer metal blocks 108 extends from one of two opposite shorter sides of the cavity 103 to between two second capillary structures 107, and each of the spacer metal blocks 108 is located between the projected location 112 of a first vapor chamber unit 11 and the projected location 122 of a second vapor chamber unit 12. The role of the spacer metal blocks 108 is to divide the working fluids into different areas where the second capillary structures 107 reside to prevent the working fluids from concentrating in some areas, which results in poor heat dissipation. The spacer metal blocks 108 also prevent the first vapor chamber units 11 and the second vapor chamber units 12 from competing over the working fluids. In an embodiment, the spacer metal blocks 108 are free from being in contact with the upper board 101, and forms a gap with the upper board 101. These gaps serve as airflow channels (e.g., similar to the gap serving as the airflow channel 105 between the metal block 104 and the upper board 101). However, the present disclosure is not limited to the above.

In an embodiment, the plurality of liquid channels 109 are formed on the surface of the lower board 102 where there is no metal block 104 and the spacer metal blocks 108. However, the present disclosure is not limited as such.

When the heat dissipation device 1 in accordance with the present disclosure is in operation, the working fluids in the temperature equalizing plate unit 10 can be more appropriately distributed in the cavity 103 with the partitioning of the metal block 104 and the spacer metal blocks 108 and the help of first capillary structures 106 and the second capillary structures 107, and the working fluids can be easily gathered above the heat source 40. When the working fluids in the liquid phase absorb the heat generated from the heat source 40 and transitions into the gas phase, the gaseous working fluids can flow into the hollow portions 111, 121 and 133 of the first, second and third vapor chamber units 11, 12 and 13 via the airflow channel 105. Meanwhile, heat dissipation can be carried out via the first and second tower fin sets 21 and 22 and the first, second and third vertical fin sets 31, 32 and 33, which causes the gaseous working fluids to condense back into liquid and flow directly onto the lower board 102 (or flow back via the second capillary structures 106 extending into the hollow portions 111 and 121) ready for the next heat dissipation cycle.

In conclusion, with the special arrangements of the first and second tower fin sets 21 and 22 and the first, second and third vertical fin sets 31, 32 and 33 in the heat dissipation device 1 of the present disclosure, the heat dissipation device 1 of the present disclosure not only increases the heat dissipation efficiency among the various fins, but also reduces the resistance of airflow flowing through the fin sets, and increases fluid disturbance among the fin sets, resulting in increased turbulence, and thus greatly improving the overall heat dissipation performance and making the heat dissipation device 1 of the present disclosure advantageous in the applications of high power processors.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. A heat dissipation device, comprising:
   a temperature equalizing plate unit;
   at least one first vapor chamber unit, at least one second vapor chamber unit and at least one third vapor chamber unit disposed on an outer surface of the temperature equalizing plate unit, wherein each of the at least one third vapor chamber unit includes a body portion and a bent portion, one end of the body portion is disposed on the outer surface of the temperature equalizing plate unit, and the bent portion is formed by bending and extending from the other end of the body portion, and a direction of bending of the bent portion is towards a side of the temperature equalizing plate unit;
   at least one first tower fin set disposed on the outer surface of the temperature equalizing plate unit to sleeve the at least one first vapor chamber unit and the at least one second vapor chamber unit and partially expose the at least one second vapor chamber unit;
   at least one second tower fin set disposed on a part of a surface of the first tower fin set to sleeve the exposed part of the at least one second vapor chamber unit; and
   at least one first vertical fin set and a second vertical fin set, wherein the first vertical fin set is disposed on the outer surface of the temperature equalizing plate unit and attaches to a side of the body portion of the third vapor chamber unit, and the second vertical fin set is disposed on the outer surface of the temperature equalizing plate unit and attaches to another side of the body portion of the third vapor chamber unit.

2. The heat dissipation device of claim 1, wherein numbers of the first vapor chamber unit, the second vapor chamber unit and the third vapor chamber unit are plural, and wherein the first vapor chamber units are disposed at intervals at two ends of the temperature equalizing plate unit, the second vapor chamber units are disposed between the first vapor chamber units at the two ends of the temperature equalizing plate unit, and the third vapor chamber units are disposed on a middle portion of the temperature equalizing plate unit between the first vapor chamber units or the second vapor chamber units.

3. The heat dissipation device of claim 1, wherein fins of the first vertical fin set and the second vertical fin set are arranged in a different direction with respect to fins of the first tower fin set or the second tower fin set.

4. The heat dissipation device of claim 1, wherein a height of the second vertical fin set is greater than a height of the third vapor chamber unit extending from the outer surface, and a height of the first vertical fin set is less than the height of the third vapor chamber unit extending from the outer surface.

5. The heat dissipation device of claim 1, further comprising at least one third vertical fin set disposed on the first vertical fin set and the first tower fin set, wherein the third vertical fin set attaches to a side face of the second tower fin set and sleeves the bent portions of the third vapor chamber units, and wherein fins of the third vertical fin set are arranged in the same direction as fins of the first vertical fin set or the second vertical fin set.

6. The heat dissipation device of claim 5, wherein the third vertical fin set exposes ends of the bent portions extending towards a side of the temperature equalizing plate unit.

7. The heat dissipation device of claim 1, wherein the first vapor chamber unit is plate-shaped, and the second vapor chamber unit and the third vapor chamber unit are pipe-shaped.

8. A heat dissipation device, comprising:
a temperature equalizing plate unit;
at least one first vapor chamber unit, at least one second vapor chamber unit and at least one third vapor chamber unit disposed on an outer surface of the temperature equalizing plate unit;
at least one first tower fin set disposed on the outer surface of the temperature equalizing plate unit to sleeve the at least one first vapor chamber unit and the at least one second vapor chamber unit and partially expose the at least one second vapor chamber unit;
at least one second tower fin set disposed on a part of a surface of the first tower fin set to sleeve the exposed part of the at least one second vapor chamber unit;
a hollow portion within each of the at least one first vapor chamber unit, the at least one second vapor chamber unit and the at least one third vapor chamber unit; and
a cavity within the temperature equalizing plate unit, wherein the hollow portions and the cavity are in communication with one another,
wherein the temperature equalizing plate unit includes an upper board, a lower board and a metal block, wherein the cavity is formed by the upper board and the lower board after assembly, and wherein the metal block is disposed on the lower board and extends to two opposite sides of the cavity and forms an airflow channel with the upper board.

9. The heat dissipation device of claim 8, wherein the cavity is filled with working fluids obstructed by the metal block.

10. The heat dissipation device of claim 9, wherein the temperature equalizing plate unit further includes at least two first capillary structures and at least two second capillary structures, wherein each of the first capillary structures is disposed on the lower board and each comes into contact with a side of the metal block, and wherein each of the second capillary structures is disposed on the lower board and connected with the first capillary structure and extending to a projected location of the first vapor chamber unit or the second vapor chamber unit on the lower board.

11. The heat dissipation device of claim 10, wherein each of the second capillary structures further extends into the hollow portion of the first vapor chamber unit or the second vapor chamber unit.

12. The heat dissipation device of claim 10, wherein the temperature equalizing plate unit further includes a plurality of spacer metal blocks disposed on the lower board and extending to one of another two opposite sides of the cavity.

13. The heat dissipation device of claim 10, wherein the metal block and each of the first capillary structures are correspondingly located near a geometric center of the third vapor chamber units and above a heat source in contact with the temperature equalizing plate unit.

14. The heat dissipation device of claim 1, wherein a height of the first vapor chamber unit extending from the outer surface is less than a height of the second vapor chamber unit extending from the outer surface.

15. The heat dissipation device of claim 1, wherein a direction in which fins of the first tower fin set and the second tower fin set are arranged, is the same as a direction in which the first vapor chamber unit and the second vapor chamber unit extend from the outer surface of the temperature equalizing plate unit.

16. The heat dissipation device of claim 1, wherein the first tower fin set exposes a top surface of the first vapor chamber unit, and wherein the second tower fin set exposes a top surface of the second vapor chamber unit.

* * * * *